(12) United States Patent
Choi et al.

(10) Patent No.: US 7,372,150 B2
(45) Date of Patent: May 13, 2008

(54) SEMICONDUCTOR WAFER HAVING IDENTIFICATION INDICATION

(75) Inventors: Sam-Jong Choi, Gyeonggi-do (KR); Gi-Jung Kim, Gyeonggi-do (KR); Kyoo-Chul Cho, Gyeonggi-do (KR); Yeon-Sook Kim, Gyeonggi-do (KR); Shin-Hyeok Han, Seoul (KR); Hoe-Sik Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 7 days.

(21) Appl. No.: 10/684,343

(22) Filed: Oct. 10, 2003

(65) Prior Publication Data

US 2004/0124502 A1  Jul. 1, 2004

(30) Foreign Application Priority Data

Oct. 10, 2002 (KR) .................. 10-2002-0061718

(51) Int. Cl.
*H01L 23/04* (2006.01)
(52) U.S. Cl. ................ 257/730; 257/618; 257/E23.179
(58) Field of Classification Search ............. 257/97, 257/48, 730, 797, 618–628, 773, E27.07, 257/E23.001, E23.004, E23.179
See application file for complete search history.

(56) References Cited

FOREIGN PATENT DOCUMENTS

| DE | 101 31 246 | * | 2/2005 |
|---|---|---|---|
| JP | 59023512 | * | 2/1984 |
| JP | 10-256105 | | 9/1998 |
| KR | 000057827 A | | 9/2000 |

OTHER PUBLICATIONS

English Language Abstract of Japan Publication No: 10-256105.
English Language Abstract of Korean Publication No: 000057827 A.

* cited by examiner

*Primary Examiner*—Hoai v Pham
*Assistant Examiner*—Dilinh Nguyen
(74) *Attorney, Agent, or Firm*—Marger Johnson & McCollom, P.C.

(57) ABSTRACT

A semiconductor wafer including an identification indication is provided. The wafer includes a convex edge with an upper surface area and a lower surface area. The identification indication is in a marking region which is disposed on a lower side surface of the convex edge. The lower side surface has a wide region where the marking region is located. This wide region has a width that is wider than an upper side surface of the wafer and thus makes a cross-section of a side of the wafer asymmetrical. With the present invention, the entire top surface of the semiconductor wafer can be utilized for a semiconductor chip region and prevents manufacturing problems associated with the uneven nature of the identification indication when the identification is located on the top surface of the wafer.

17 Claims, 8 Drawing Sheets

SEMICONDUCTOR WAFER HAVING IDENTIFICATION INDICATION

This application claims priority from Korean Patent Application No. 2002-61718 filed on Oct. 10, 2002, in the Korean Intellectual Property Office, the contents of which are incorporated herein in their entirety by reference.

FIELD OF THE INVENTION

The present invention generally relates to a semiconductor device and specifically to a semiconductor wafer having an identification indication and a method of fabricating the same.

BACKGROUND OF THE INVENTION

In order to analyze various process steps in the fabrication of semiconductor devices, a method for identifying each semiconductor wafer is usually required. Conventionally, identification indications such as letters, numerals, or bar cords are written on each of the semiconductor wafers. The identification indication provides a method to identify each wafer after process conditions are applied to each of the wafers. By having an identification indication on each wafer the results of exposing the wafers to the conditions can be analyzed. This analysis of the effects of process conditions on wafers makes failure analysis and process feedback feasible, thus reducing the time for developing products and preventing errors from being repeated.

Generally, the identification indication is carved on top of the semiconductor substrate using a laser beam.

FIG. 1 is a diagram of a top plane view of a semiconductor wafer having an identification indication in accordance with the prior art. FIG. 2 is a diagram of a perspective view of a marking region illustrated in FIG. 1. FIG. 3 is a vertical cross-sectional view diagram taken along a line I-I' of FIG. 2, which shows dots that are formed by laser marking.

Referring to FIGS. 1, 2, and 3, a marking region 20 is disposed at an edge 15 of an upper side of a semiconductor wafer 10. The marking region 20 is where an identification indication is written. Therefore, the usable chip region 25, in which semiconductor devices are formed, is decreased by as much area as is needed for the marking region 20. If the area of the chip region 25 decreases, then fewer chips can be produced per wafer, which leads to an increase in the unit cost of the semiconductor production.

In addition, the identification indication is composed of dots 30 that are conventionally formed by laser beam. As illustrated in FIG. 3, the dots 30 do not have flat shapes. This potentially can cause problems during the subsequent process of forming the semiconductor circuits on the wafer such as particle defects due to the non-uniform shape of the identification indication. In addition, the non-flat shapes of the dots 30 may cause a chuck defect while the semiconductor wafer 10 is being fixed.

SUMMARY OF THE INVENTION

One aspect of the present invention is directed to effectively utilizing the area of a semiconductor wafer. Another aspect of the present invention is directed to reducing the particle defects due to a non-uniform shape of the identification indication on a semiconductor wafer.

In accordance with broad aspects of the present invention, a semiconductor wafer including an outwardly convex edge section is provided. The convex edge is divided into an upper side surface and a lower side surface The lower side surface can be wider than the upper side surface. Furthermore a wider region of the lower side surface of the wafer can also be formed to be thicker than the upper side surface. This formation of different side surfaces can be applied to the entire circumference of the wafer as well.

The marking region is disposed at the wide region of the lower side surface of the convex edge. The wafer identification indication is still preferably composed of dots formed by a laser beam and may further include additional information, such as a bar code.

DETAILED DESCRIPTION OF THE INVENTION

Figure 1:
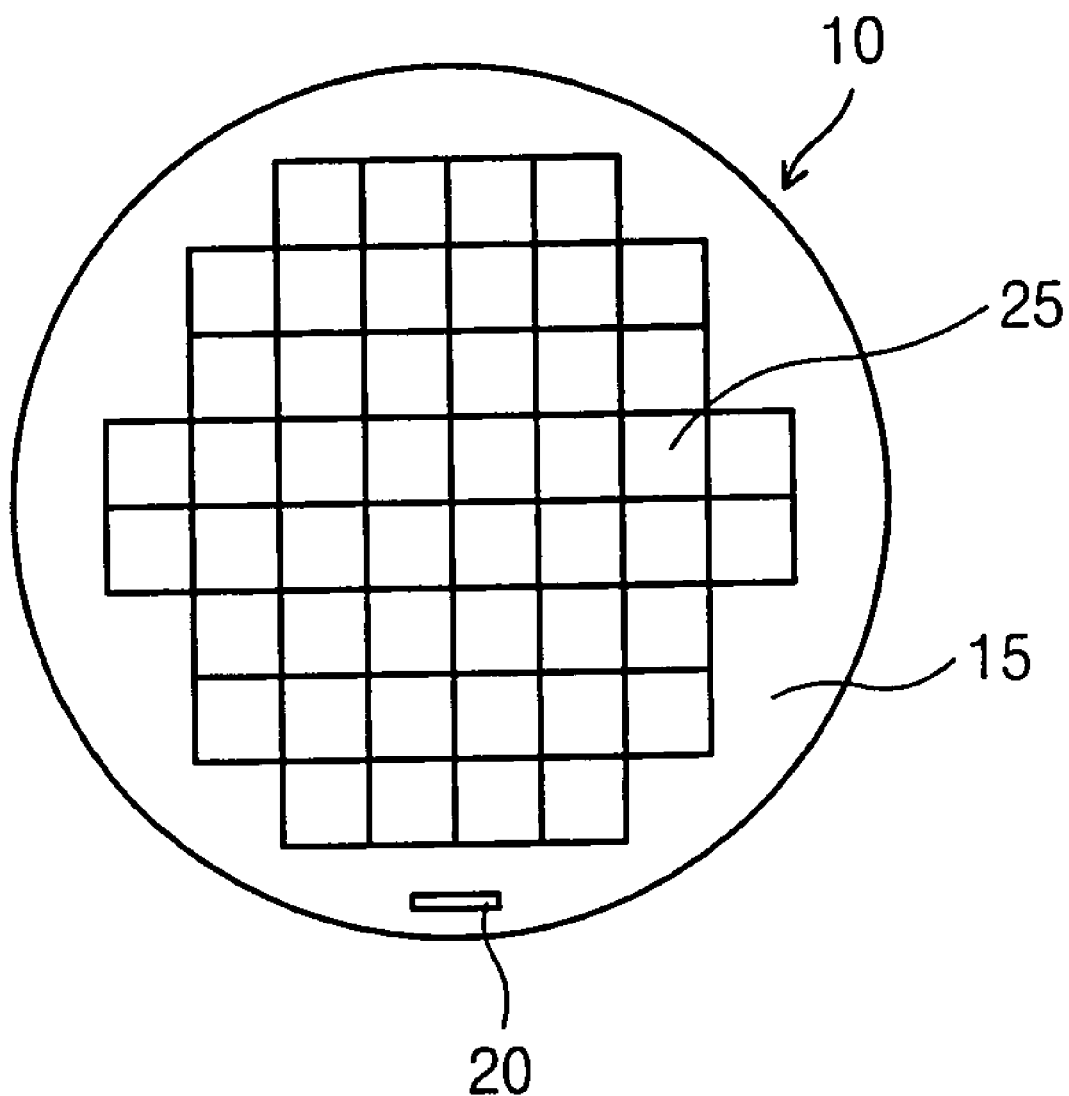
FIG. 1 is a top plane view diagram of a semiconductor wafer having an identification indication that is fabricated in accordance with prior art.
Figure 2:
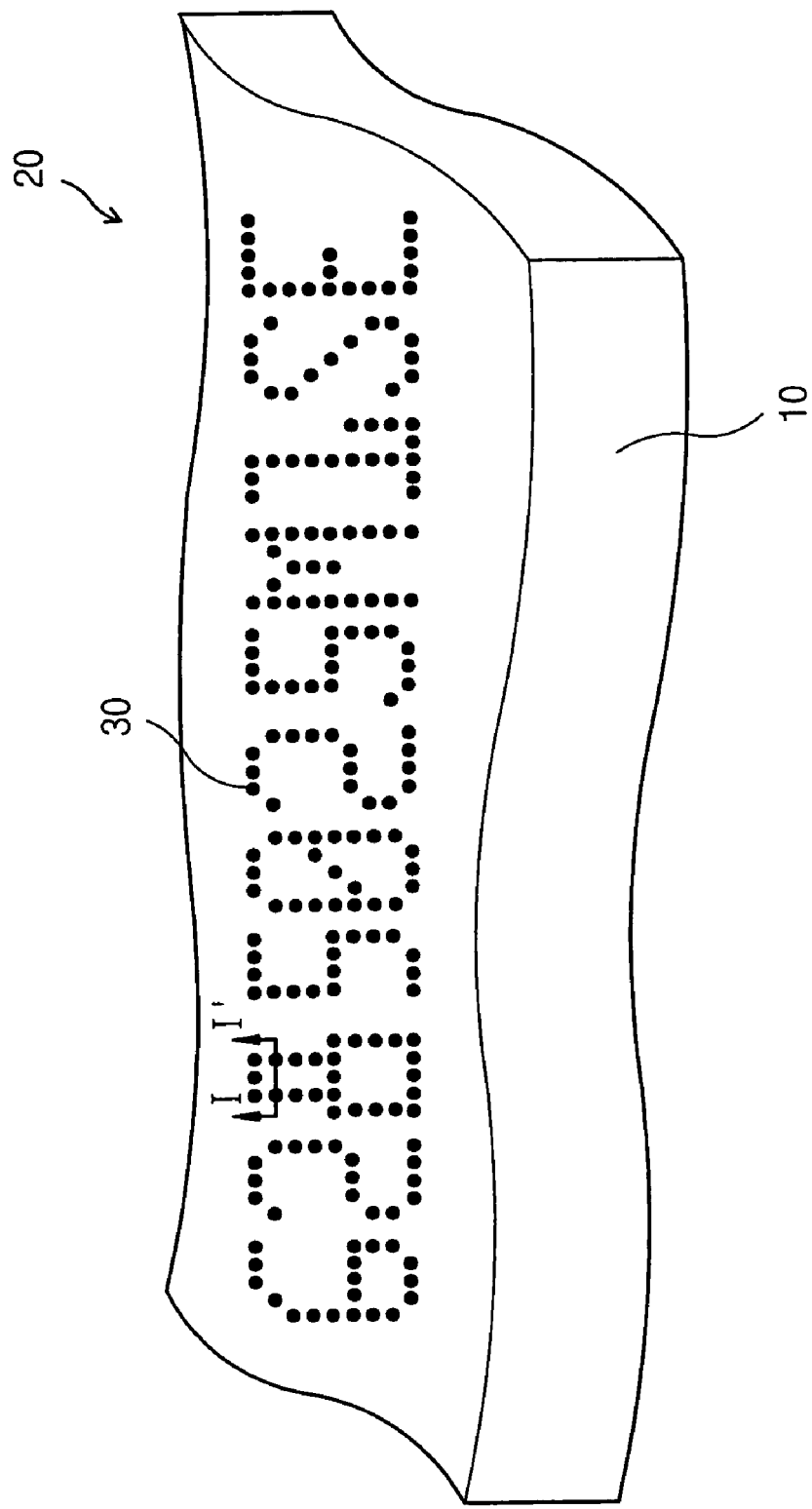
FIG. 2 is a perspective view diagram of a typical identification indication.
Figure 3:
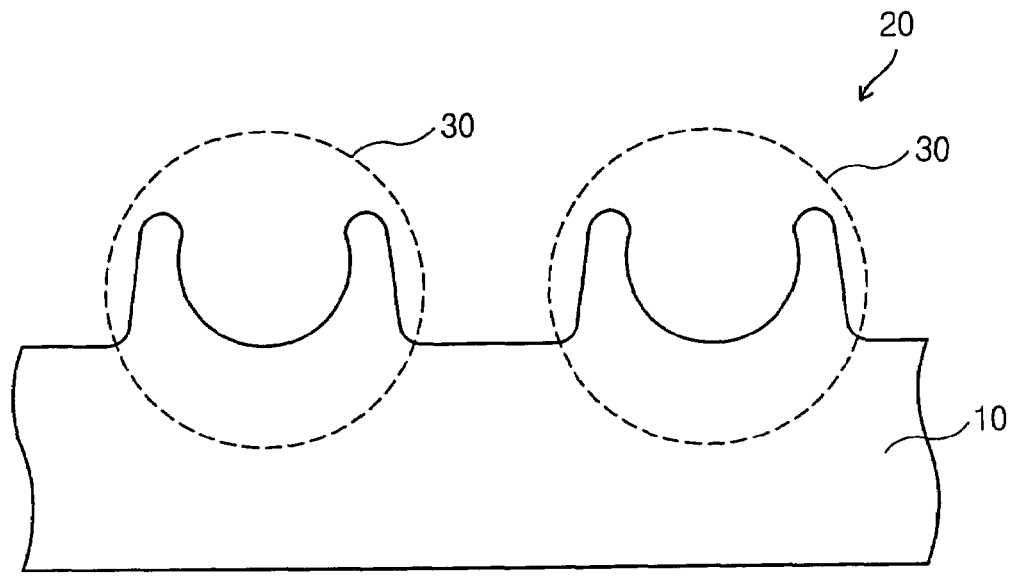
FIG. 3 is a vertical cross-sectional view diagram taken along line I-I' of FIG. 2, showing the identification indication.

The present invention will be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Figure 4:
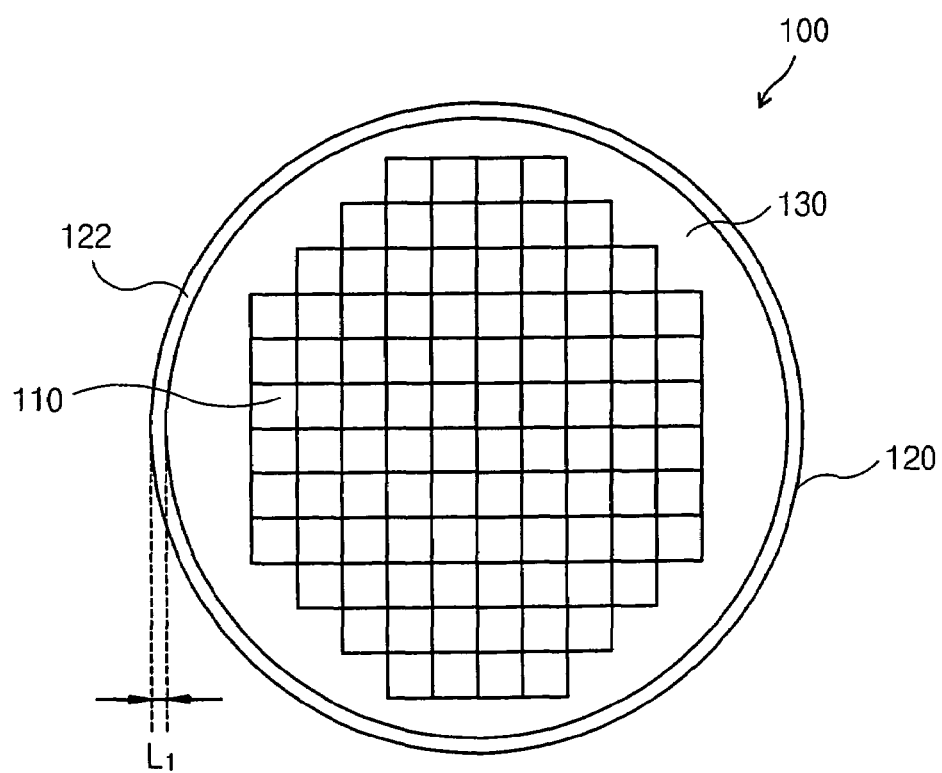
FIG. 4 is a diagram that shows a front side of the semiconductor wafer in accordance with an embodiment of the present invention.
Figure 5A:
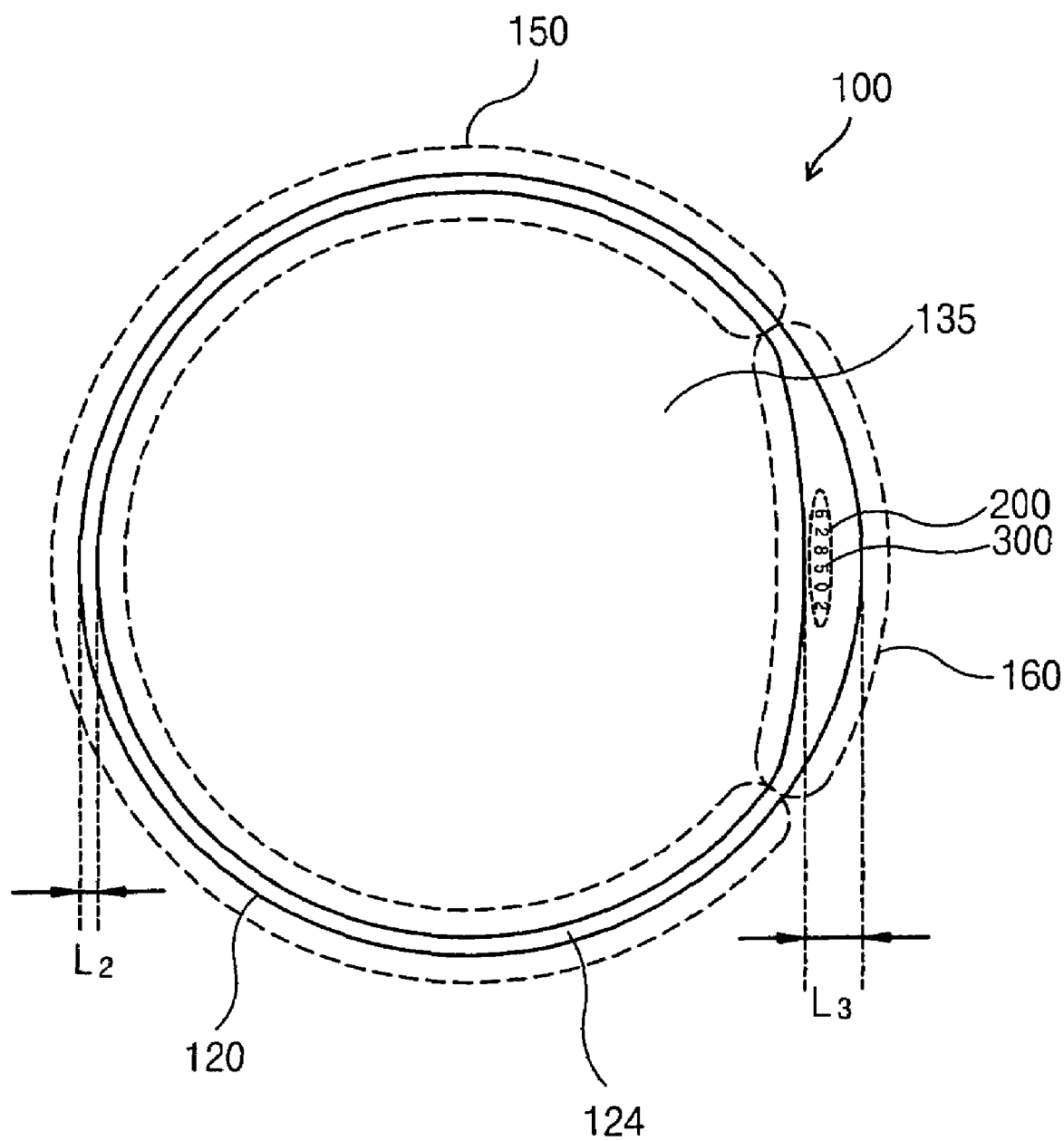
FIG. 5A is a diagram that shows a back side of the semiconductor wafer in accordance with this embodiment of the present invention.

FIG. 4 shows a front side of a semiconductor wafer in accordance with an embodiment of the present invention. FIG. 5A shows a back side of the semiconductor wafer in accordance with this embodiment.

Referring to FIGS. 4 and 5A, a semiconductor wafer includes a top surface 130, a bottom surface 135, and a side surface 120. Additionally, a chip region 110 and an edge region are disposed on the top surface 130. The chip region 110 is the region where semiconductor devices are fabricated and defined by a scribe line. The edge region is the rest of the top surface 130 not included in the chip region 110, and it borders the side surface 120 of the wafer.

Figure 7:
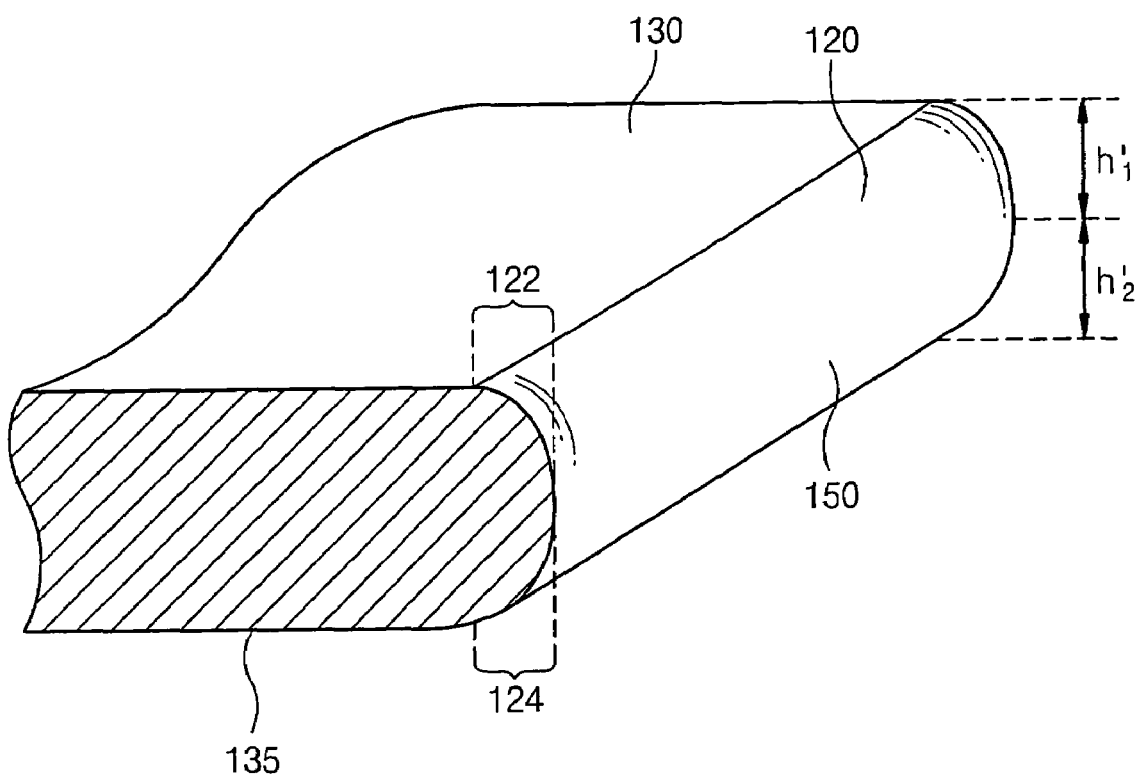
FIG. 7 is a perspective view diagram of a side of a semiconductor wafer with symmetric side surfaces.

The side surface 120 is not strictly perpendicular to the top 130 and the bottom 135 surfaces, but rather formed in an outward convex shape such as that shown in FIG. 7. The convex side surface 120 is divided into an upper side surface 122 and a lower side surface 124. There is a boundary between the upper surface 122 which forms the top part of the convex shape and the top 130 and there is a boundary between the lower surface 124 and the bottom surface 135.

The upper side surface 122 is preferably formed to have a constant width L1 along an entire circumference of the semiconductor wafer 100. Meanwhile, the lower side surface 124 is divided into a narrow region 150 and a wide region 160. The wide region 160 has a width L3, which is larger than a width L2 of the narrow region 150. The width L3 is also larger than the width L1 of the upper side surface 122.

As illustrated in FIGS. 5A and 7, a cross-section of the side 120 may be symmetric. That is, the upper side surface 122 and the lower side surface 124 may be identical in a width and in a thickness (i.e., L1=L2, and h1'=h2'). This symmetric side 120 is preferably formed at the narrow region 150.

A marking region 200, which is the region where an identification indication 300 is written, is disposed at the wide region 160 of the lower side surface 124. Forming the identification indication 300 here can prevent particles caused by the non-uniformly-shaped dots from being transferred into the chip region 110. In addition, the marking region 200 is not formed on the top surface 130 of the semiconductor wafer where the semiconductor devices are formed. Thus, more of the top surface of the wafer can be efficiently utilized for the chip region 110.

A vacuum chucking method, which utilizes a pressure of vacuum, may be used so as to fix the semiconductor wafer 100. The vacuum chucking method requires close adhesion between a vacuum chuck and the semiconductor wafer 110. Thus, by forming the marking region 200 on the lower side surface 124 of the wafer, a chucking fault of the semiconductor wafer 100 due to non-uniform shape of the identification indication 300 can be prevented.

Figure 5B:
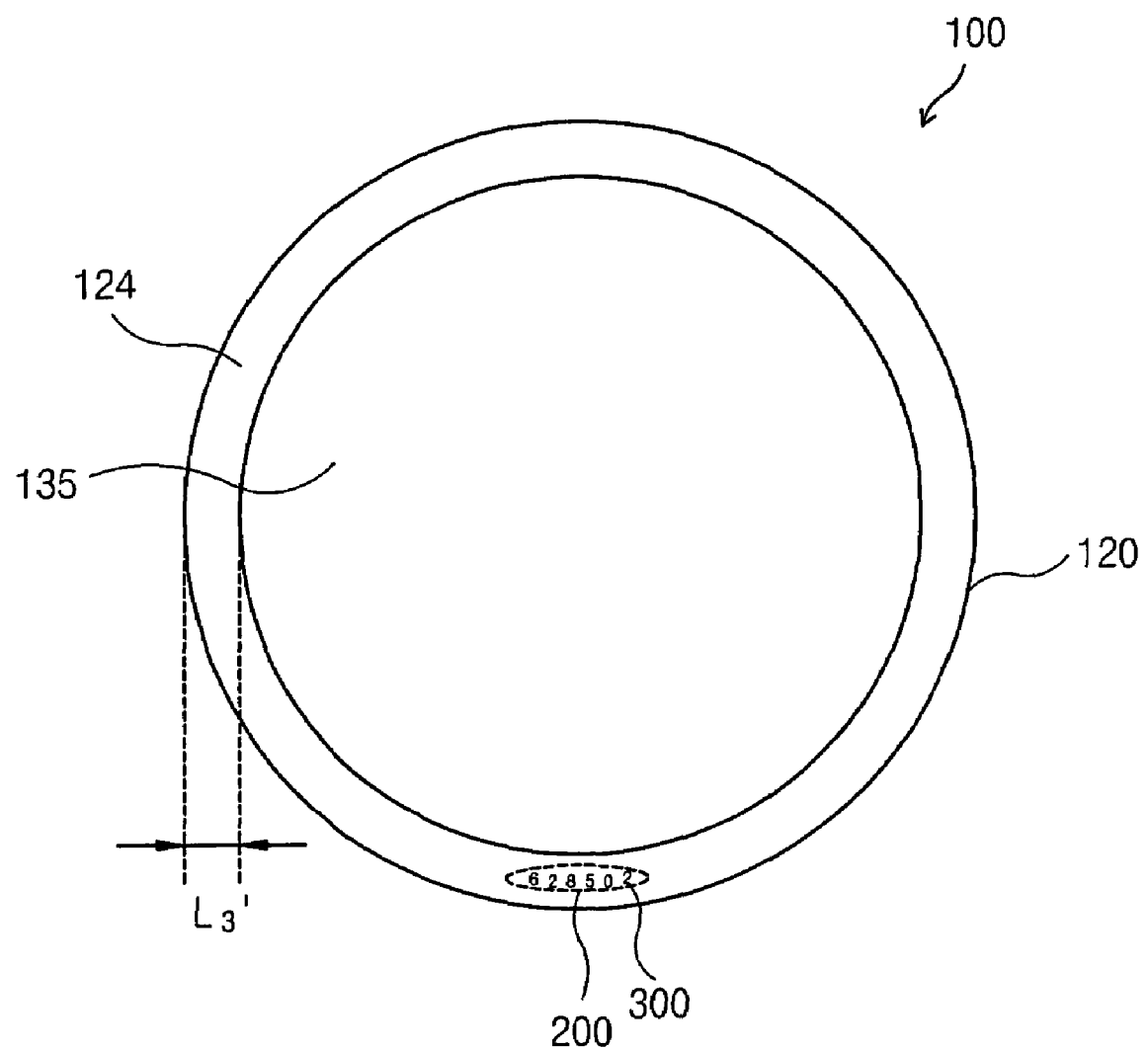
FIG. 5B is a diagram that shows a back side of the semiconductor wafer in accordance with another embodiment of the present invention.

Another embodiment of the present inventive idea can be performed, as illustrated in FIG. 5B. In this alternate embodiment the lower side surface 124 may be formed to have a constant width L3' along an entire circumference of the semiconductor wafer 100. In this case, the lower side 124 forms wide region 160 throughout the circumference. The width L3' is preferably wider than the width L1 of the upper side surface 122. Again the marking region 200 is disposed at the lower side surface 124.

Figure 6:
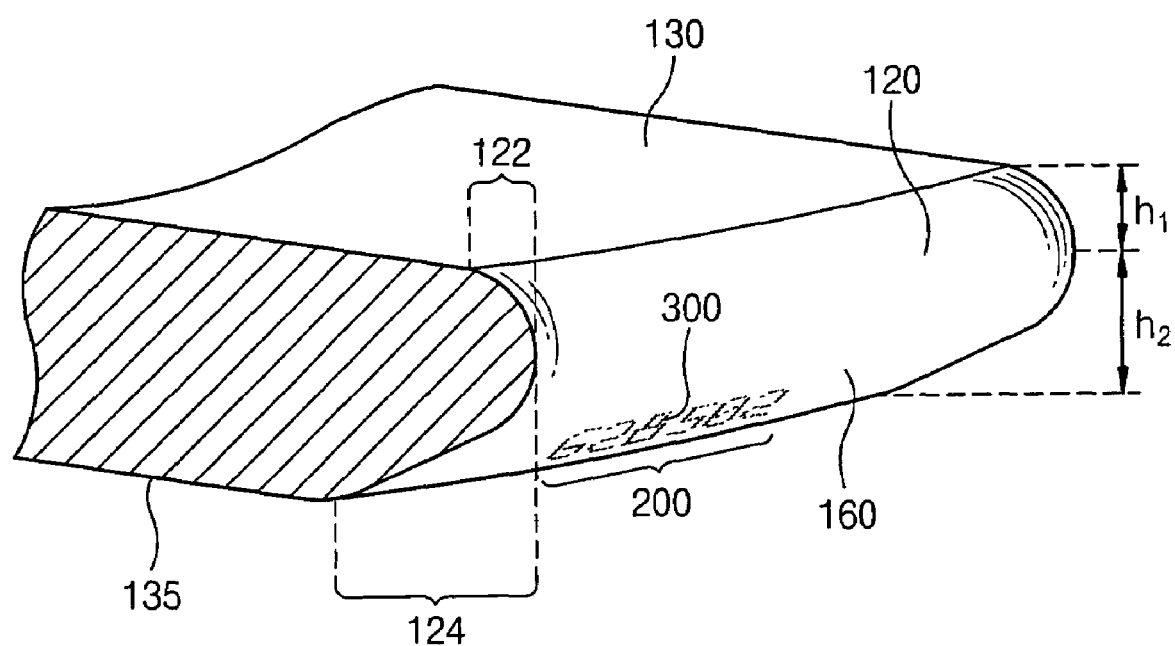
FIG. 6 is a perspective view diagram of a side of the semiconductor wafer in accordance with the embodiment of the present invention described first.

In the above two embodiments, the lower side surface 124, where the marking region is disposed, is wider than the upper side surface 122, such that the semiconductor wafer 100 may have asymmetrical lateral surfaces. That is, as illustrated by the cross-sectional diagram of the marking region 200 of the semiconductor wafer in FIG. 6, the lower side surface 124 is wider than at the upper side surface 122. In addition, a thickness h1 of the upper side surface 122 is preferably thinner than a thickness h2 of the lower side surface 124 at the wide region 160 (i.e., h1<h2).

Figure 8:
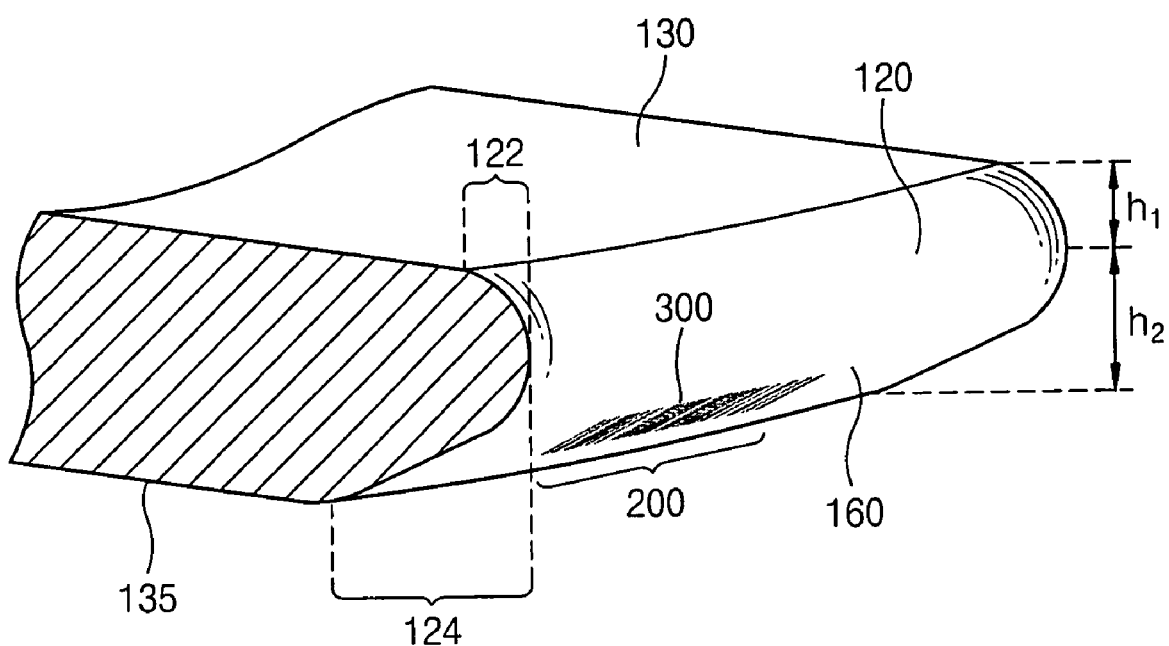
FIG. 8 is a perspective view diagram of a side of the semiconductor wafer in accordance with yet another embodiment of the present invention.

An identification indication 300 including carved symbols, such as numerals or letters, is formed at the marking region 200. The symbols composing the identification indication 300 are preferably formed of a plurality of dots that are carved by a laser. Meanwhile, as illustrate in FIG. 8, the identification indication 300 may comprise patterns having information, such as, for example, a bar code.

According to the present invention, a wider region disposed at a lower side surface of a semiconductor wafer is an advantageous location for an identification indication. By locating an identification indication on a lower side surface, a top surface of the semiconductor wafer can be efficiently utilized in the fabrication of semiconductor chips. Not only is there more useable area on the top surface, but also a particle problem and chuck fixing fault, which are due to the non-uniform shape of the identification region, can be prevented. As a result of decreasing faults, manufacturing productivity the semiconductor chips can be increased and production costs can be reduced.

What is claimed is:

1. A semiconductor wafer comprising:
   a top surface, a bottom planar surface, and an outwardly convex edge surface connecting the top surface and the bottom planar surface, the outwardly convex edge surface having an upper side surface and a lower side surface;
   a boundary between the bottom planar surface and the outwardly convex edge surface; and
   a marking region disposed on the lower side surface, wherein a wafer identification indication is carved in the marking region,
   wherein a distance from a center of the bottom planar surface to a first portion of the boundary adjacent to the marking region is less than a distance from the center of the bottom planar surface to a second portion of the boundary.

2. The semiconductor wafer of claim 1, wherein a width of a portion of the lower side surface adjacent to the second portion of the boundary is the same as a width of the upper side surface.

3. The semiconductor wafer of claim 1, wherein a thickness of the upper side surface is thinner than a thickness of a region on the lower side surface.

4. The semiconductor wafer of claim 1, wherein the lower side surface is thicker than the upper side surface along an entire circumference of the semiconductor wafer.

5. The semiconductor wafer of claim 1, wherein the wafer identification indication comprises dots that are formed by a laser beam.

6. The semiconductor wafer of claim 1, wherein the wafer identification indication comprises patterns representing information.

7. The semiconductor wafer of claim 1, wherein the outwardly convex edge surface is asymmetric with respect to the upper and the lower side surfaces.

8. The semiconductor wafer of claim 1, wherein the top surface is planar and a radius of a boundary between the top surface and the outwardly convex edge surface is constant.

9. A semiconductor wafer comprising:
   a planar bottom surface;
   an outwardly curved edge surface, the outwardly curved edge surface having an upper side surface and a lower side surface; and
   a boundary between the planar bottom surface and the lower side surface;
   a marking region disposed on the lower side surface, wherein a wafer identification indication is carved in the marking region, and wherein the outwardly curved edge surface is asymmetric with respect to the upper and the lower side surfaces, and wherein a distance from a center of the planar bottom surface to a first portion of the boundary adjacent to the marking region is less than a distance from the center of the planar bottom surface to a second portion of the boundary.

10. The semiconductor wafer of claim 9, wherein a width of the upper side surface equals a width of the lower side surface.

11. The semiconductor wafer of claim 9, wherein a width of the upper side surface does not equal a width of the lower side surface.

12. The semiconductor wafer of claim 9 wherein the marking region includes indentations that identify the wafer.

13. The semiconductor wafer of claim 9, further comprising a planar top surface, wherein a radius of a boundary between the planar top surface and the outwardly convex edge surface is constant.

14. A semiconductor wafer comprising:
a top surface, a bottom planar surface, and an outwardly convex edge surface connecting the top surface and the bottom planar surface, the outwardly convex edge surface having an upper side surface and a lower side surface;
a substantially circular boundary between the bottom planar surface and the outwardly convex edge surface;
a marking region disposed on the lower side surface; and
a wafer identification indication carved in the marking region,
wherein a distance from a center of the bottom planar surface to a first portion of the boundary adjacent to the marking region is less than a distance from the center of the bottom planar surface to a second portion of the boundary.

15. A semiconductor wafer comprising:
a top surface, a bottom surface, and an outwardly convex edge surface connecting the top surface and the bottom surface and defining an outer perimeter of the semiconductor wafer, the outwardly convex edge surface comprising:
an upper side surface; and
a lower side surface;
a boundary between the bottom surface and the lower side surface, wherein a width of a first portion of the lower side surface extending contiguously between a first portion of the outer perimeter and a first portion of the boundary is greater than a width of a second portion of the lower side surface extending contiguously between a second portion of the outer perimeter and a second portion of the boundary;
a marking region in the first portion of the lower side surface; and
a wafer identification indication in the marking region.

16. A semiconductor wafer comprising:
a top surface, a bottom surface, and an outwardly convex edge surface connecting the top surface and the bottom surface and defining an outer perimeter of the semiconductor wafer;
a boundary between the bottom surface and the outwardly convex edge surface, wherein a distance between a first portion of the boundary and a first portion of the outer perimeter is greater than a distance between a second portion of the boundary and a second portion of the outer perimeter;
a marking region on the outwardly convex edge surface between the first portion of the boundary and the first portion of the outer perimeter; and
a wafer identification indication in the marking region.

17. A semiconductor wafer comprising:
a top surface, a planar bottom surface, and an outwardly convex edge surface connecting the top surface and the planar bottom surface;
a boundary between the planar bottom surface and the outwardly convex edge surface, wherein a first portion of the boundary has a first curvature within the plane of the planar bottom surface and a second portion of the boundary has a second curvature within the plane of the planar bottom surface greater than the first curvature;
a marking region on a portion of the outwardly convex edge surface adjacent to the first portion of the boundary; and
a wafer identification indication in the marking region.

* * * * *